United States Patent [19]

Tracy

[11] Patent Number: 4,804,978
[45] Date of Patent: Feb. 14, 1989

[54] EXPOSURE CONTROL SYSTEM FOR FULL FIELD PHOTOLITHOGRAPHY USING PULSED SOURCES

[75] Inventor: David H. Tracy, Norwalk, Conn.

[73] Assignee: The Perkin-Elmer Corporation, Norwalk, Conn.

[21] Appl. No.: 157,755

[22] Filed: Feb. 19, 1988

[51] Int. Cl.$^4$ .................. G01D 9/42; G01D 15/10
[52] U.S. Cl. ............................... 346/108; 346/76 L
[58] Field of Search ................ 346/76 L, 108, 160

[56] References Cited

U.S. PATENT DOCUMENTS

| 4,264,986 | 4/1981 | Willis | 346/76 L X |
| 4,613,877 | 9/1986 | Spencer et al. | 346/108 X |
| 4,698,692 | 10/1987 | Fry et al. | 346/108 X |
| 4,719,474 | 1/1988 | Hansen et al. | 346/108 |
| 4,754,291 | 6/1988 | Horikawa | 346/108 |

Primary Examiner—George H. Miller, Jr.
Attorney, Agent, or Firm—Paul A. Fattibene; Thomas P. Murphy; Edwin T. Grimes

[57] ABSTRACT

A photolithography exposure control system tolerant of noisy pulsed light sources having a controllable variable attenuator. A detector monitors the exposure dose of a light pulse enabling a controller to trigger another light pulse, when a predetermined attenuator is positioned in its path. A high degree of exposure control is achieved with a minimum number of light pulses or shots.

19 Claims, 2 Drawing Sheets

EXPOSURE CONTROL SYSTEM FOR FULL FIELD PHOTOLITHOGRAPHY USING PULSED SOURCES

FIELD OF INVENTION

This invention relates generally to accurately controlling exposure in photolithography, and more particularly to optimizing exposure control when noisy pulsed light sources are used.

BACKGROUND OF THE INVENTION

Photolithography is a lithographic technique using an image produced by photography for printing on a print-nonprint surface. With this technique pulsed light sources can be used to expose a light sensitive surface. Typically, pulsed light sources have a pulse-to-pulse energy fluctuation. This pulse-to-pulse fluctuation makes accurate exposure difficult. Pulsed sources are additionally troublesome because the mean energy per shot may drift with time and other factors. This compounds the difficulty in maintaining the correct exposure. Additionally, the correct exposure may not require an integal number of shots which contributes to the already inaccurate exposure. Therefore, there are problems in maintaining correct exposure when using pulsed light sources.

A common technique used to control the exposure dose is to increase the number of shots or light pulses needed to expose the light sensitive surface. With a large number of shots the fluctuation in each shot is not as critical in maintaining the proper exposure. But, increasing the number of shots increases the time needed for exposure as well as in most situations requires a large attenuation of the pulsed light source. Increasing the number of shots required for exposure can control exposure to within acceptable limits, but is very inefficient.

Attempts have also been made to control the average pulse energy of the pulsed light source so that it is an exact sub-multiple of the required dose for exposure. This technique requires a pulsed energy source with little noise or pulse-to-pulse energy fluctuation. Even with a low noise pulsed light source the number of shots required to obtain a reasonably accurate exposure dose is large.

While the above techniques have greatly increased the use of pulsed sources in photolithography and have achieved some degree of control over the exposure dose they have proven to be inefficient exposure systems. The exposure necessary to obtain a reasonably precise exposure dose is time consuming and shortens the lifetime of the pulsed source which is usually measured by the number of shots fired.

SUMMARY OF THE INVENTION

The present invention is directed to a device for precisely controlling the exposure dose in photolithographic systems using pulsed light sources. The pulsed light source is typically a pulsed laser. The pulsed light is directed through a variable attenuator that controllably attenuates the light pulse before illuminating the system to be exposed. A portion of the light pulse is measured by an exposure dose monitor to determine its fluence. A controller connected to the variable attenuator and the pulsed light source uses the fluence information from the exposure dose monitor to determine the minimum attenuation needed to provide the required exposure dose. The controller can consider the pulse-to-pulse energy fluctuation of the source in determining the amount of attenuation needed to provide accurate exposure with a minimum number of shots.

Accordingly, it is an objective of the present invention to provide accurate exposure with a minimum number of shots.

It is a further objective of the present invention to provide an exposure system tolerant of noisy light pulse sources.

It is yet another objective of the present invention to provide the maximum fluence per light pulse while minimizing the probability of overexposure.

It is an advantage of the present invention that the pulsed light source has a longer life.

It is a further advantage of the present invention that a simpler power supply can be used to control the light source.

It is yet a further advantage of the present invention that the overall exposure time is reduced resulting in increased system throughput.

It is a feature of the present invention that the pulsed light source is controllably variably attenuated.

It is another feature of the present invention that the light source is controlled by the timing of discharge in relation to the position of a rotating attenuation wheel having constant angular velocity.

These and other objects, advantages, and features will become readily apparent in view of the following more detailed description.

DETAILED DESCRIPTION OF THE PREFERRED EMBODIMENT

Figure 1:
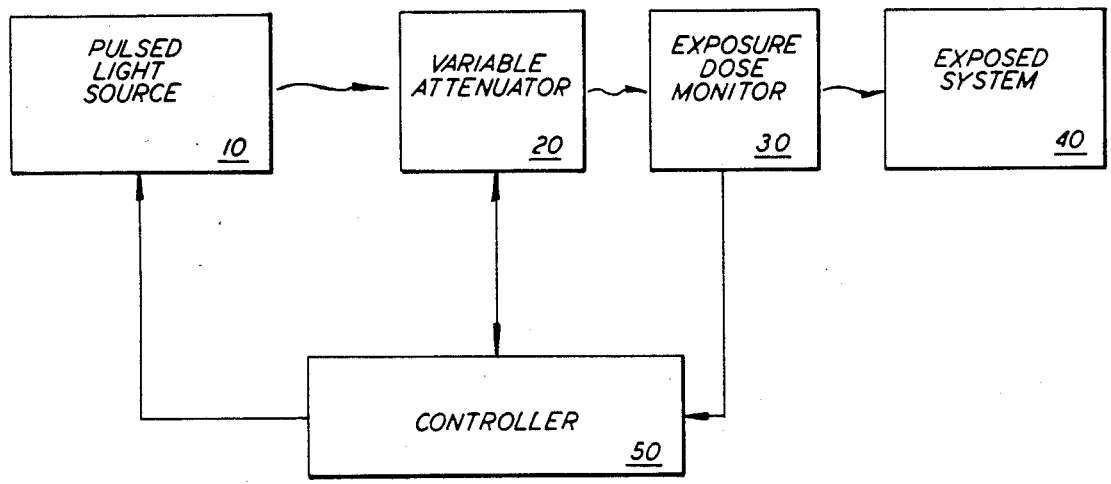
FIG. 1 is block diagram illustrating the invention.

FIG. 1 illustrates the present invention. As is shown in FIG. 1, pulsed light source 10 emits a pulse of light or shot when required. Pulsed light source 10 is typically a laser, such as an excimer, frequency multiplied, or free-electron laser. The light source can also be a plasma blackbody XUV or an X-ray source. The pulse of light then travels through a variable attenuator 20. The variable attenuator 20 can be of any type of material that will predictably attenuate the light pulse or shot. For example, electro-optic modulators, including an acousto-optic and Pockels cell devices, variable spaced Fabry-Perot etalons, partially transmitting meshes and perforated plates, partially transmitting or partially reflecting optical coatings or surfaces, bulk absorbing optical materials, and geometrical means such as moving blades or shutters. In the case of optical coatings, such as dielectric films, variation of transmission may be obtained by tilting the attenuator elements as well as by interchanging fixed elements or translating elements across the pulsed light which have a transmission gradient. In all of these cases, either step wise attenuation control or continuous variable control is possible. Stepwise attenuation is accomplished by varying portions of the attenuator 20 by discrete intervals of attenuation. These discrete intervals of attenuation can be equal, logarithmic, or any amount that is suitable for the particular application.

After the light pulse passes through the variable attenuator 20 it enters exposure dose monitor 30. The exposure dose monitor 30 should not attenuate the transmission of the light pulse more than necessary. The exposure dose monitor 30 detects the fluence leaving the variable attenuator 20 and being delivered to the exposed system 40. A value representative of the fluence transmitted to the exposed system 40 is communicated by the exposure dose monitor 30 to the controller 50.

The exposed system 40 can be any one of a number of image transfer systems such as the transferring of an image of a mask or reticle on to a photoresist coated substrate for conventional developing, or the image pattern created by the exposed system may be used for a variety of direct photoetching, photoablation, or photodeposition processes.

The controller 50 communicates with the pulsed light source 10, the variable attenuator 20, and the exposure dose monitor 30. The controller 50 uses the information received from the exposure dose monitor 30 to control the cooperation between the variable attenuator 20 and the pulsed light source 10 to optimize the exposure dose delivered to the exposed system 40. Essentially, the controller will select the smallest attenuation available with the variable attenuator 20 that will, with a high probability, not result in an overexposure by an amount exceeding the exposure tolerance. The controller 50 can also take into account the actual unattenuated pulse energy distribution of the pulsed light source under current conditions. This can be continuously monitored by the controller 50 from the information received by the exposure dose monitor 30.

The controller 50 can be comprised of various well known circuitry. For example, the controller 50 can comprise a microprocessor (such as an Intel 80286), together with a numeric co-processor (such as an Intel 80287), program memory, data memory, an analog to digital converter (such as an analog Devices 774 12 bit ADC) for input of data from the pulse energy monitor 30, digital input for monitoring the position of the variable attenuator 20, digital output for firing the pulsed source 10 and (optionally) for controlling the variable attenuator, and a clock (optionally) for controlling the variable attenuator, and a clock or oscillator among other well known circuitry.

The controller can take the form of a microcomputer, such as an IBM PCAT microcomputer, which can be configured or programmed to perform various functions. Functions that can be accomplished in this way using existing or easily created software and hardware include, but are not limited to; calibrating and storing the degree of attenuation of each attenuating element by comparing mean transmitted energies though the various elements, averaged over many shots of the source; measuring and updating the pulse energy output of the light source (and its pulse energy distribution function) on a continuing basis, and storing same; planning an exposure sequence based on the desired exposure dose, the attenuator calibration, and the stored pulse energy distribution function data; measuring the exposure energy actually delivered to the exposure system on each shot of the pulsed source; computing and storing the cumulative exposure dose following each shot of an exposure sequence; comparing the cumulative dose to the desired total exposure; selecting the attenuation required for the next light source pulse in the exposure sequence; controlling a motor or other means for adjusting or selecting the appropriate attenuation; determining the correct timing for firing the pulsed source so as to achieve the required attenuation, and issuing the firing command at the required time (taking into account the attenuator indexing information from the sensor 28); and finally terminating the exposure sequence when the cumulative exposure reaches the targeted exposure, within specified tolerance bounds.

For a simple example of how the present invention can reduce the number of shots while maintaining the exposure tolerance consider the following. The pulsed light source operates with a mean unattenuated fluence f with a desired exposure for the system being something greater than f. The pulsed light source is noisy and has a pulse-to-pulse energy fluctuation with a high of 1.1 f and a low of 0.9 f. The controller 50 begins delivering unattenuated shots or pulses while the exposure dose monitor 30 monitors the cumulative dose. The controller 50 then stops the pulsed light source 10 from firing when the remaining exposure dose is less than 1.1 f. The controller 50 then positions the variable attenuator 20 so that it has a transmission value of 1.1 f divided by the remaining exposure dose before instructing the pulsed light source 10 to deliver a pulse. The exposure dose monitor 30 sends information about the last pulse to controller 50. A new remaining exposure is calculated and the attenuation is again adjusted to 1.1 f divided by the new remaining exposure dose before the controller 50 instructs the pulsed light source 10 to deliver another pulse. This sequence is repeated until the total exposure is within a specified tolerance band. In the present example, a tolerance of plus or minus 0.5% can be obtained in at most 3 attenuated shots following any unattenuated exposure that might be required. Each additional shot will improve the exposure precision by an order of magnitude. The above example assumes that a continuous variable attenuator is used, but if a stepped attenuator is used a somewhat greater number of shots or pulses is required to reach the same exposure precision.

Figure 2:
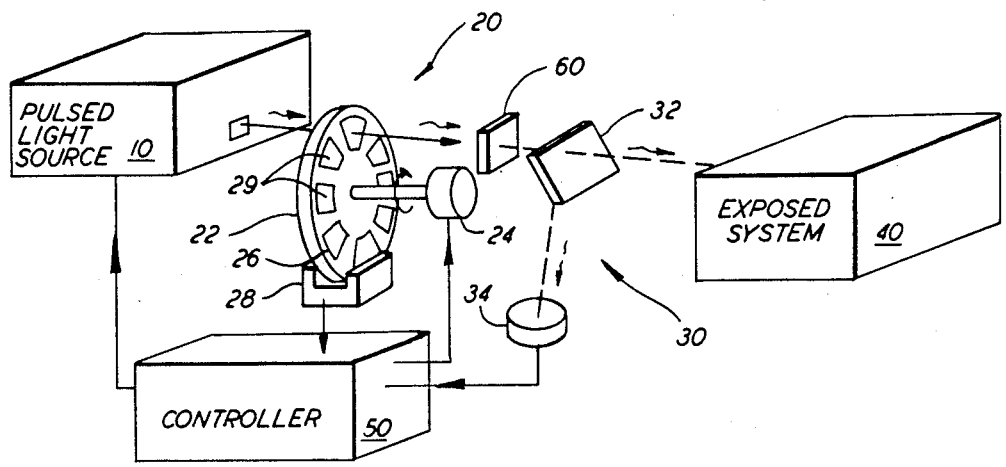
FIG. 2 is a pictorial representation of an embodiment of the present invention.

In FIG. 2 another embodiment of the present invention is illustrated. In FIG. 2 the variable attenuator 20 is comprised of a wheel 22 attached to motor 24. Motor 24 rotates wheel 22 such that individual attenuators 29 can be selectively positioned in the path of the light pulse generated by the pulsed light source 10. A hole 26 is positioned along the peripheral portion of wheel 22 so that sensor 28 can detect its position. Sensor 28 can be any type of sensor capable of detecting the position of hole 26, such as a photoemitter-detector pair. Sensor 28 then communicates the angular position of wheel 22 to controller 50. The controller 50 can then cause the pulsed light source to emit a pulse when one of the selected attenuators 29 is positioned in the path of the light pulse.

Also in FIG. 2 can be seen the exposure dose monitor 30. Exposure dose monitor 30 comprises a beam splitter 32 and detector 34. The beam splitter 32 redirects a small portion of the light pulse to detector 34 to quantify the energy or exposure dose of that particular light pulse. Ideally, the exposure dose monitor 30 does not affect the exposure dose delivered to the exposed system 40. In any event, the small effect that the energy dose monitor could have on the exposure dose delivered to the exposed system 40, can be compensated for by the controller 50.

A fixed attenuator 60 is also illustrated in FIG. 2 should the pulsed light source 10 emit a pulse of light that has an exposure dose greater than that needed by the exposed system 40. With the attenuator 60 in the path of the emitted light pulse the exposure dose can be attenuated so that multiple light pulses are needed to obtain the required exposure dose. The attenuator wheel 20 can then be positioned to obtain the desired exposure tolerance with the minimum number of shots.

Figure 3:
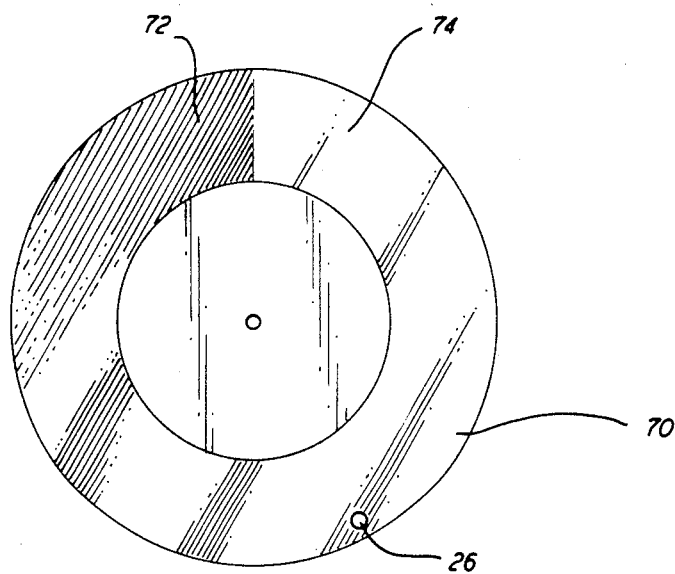
FIG. 3 is a front elevational view of an attenuation wheel used in one embodiment of the present invention.

FIG. 3 illustrates a type of wheel attenuator that can be used in place of the multiple discrete step attenuator wheel 22 illustrated in FIG. 2. The continuous attenuator 70 illustrated in FIG. 3 ranges from a high attenuation at portion 72 and continuously decreases in attenuation clockwise around the circumferential portion to a low attenuation at portion 74. This continuously variable transmission attenuator can be used provided that any resulting spatial transmission gradient across the transmitted beam or light pulse is permitted by the optical design of the illumination uniforming optics. The continuously variable transmission attenuator can be fabricated as a multilayer thin film coating.

Figure 4:
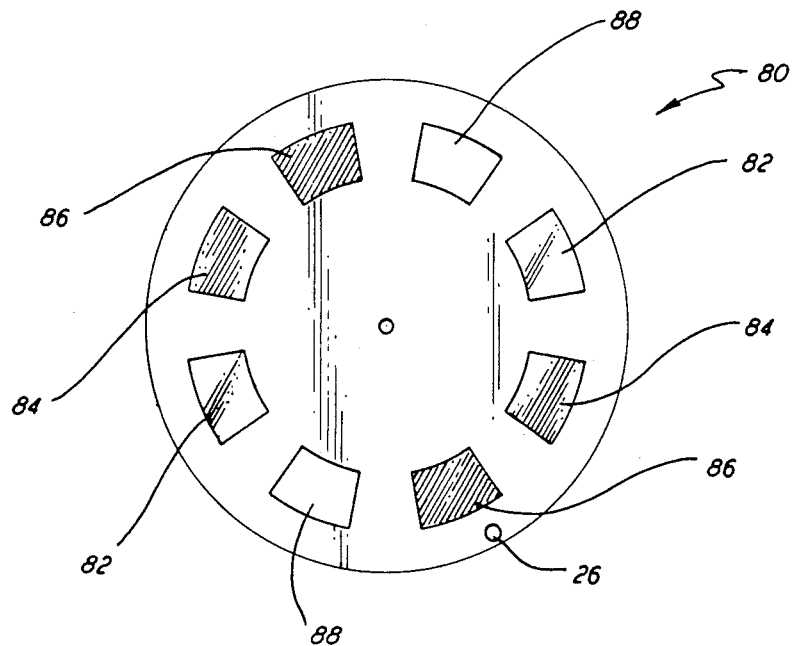
FIG. 4 is a front elevational view of another attenuation wheel used in another embodiment of the present invention.

FIG. 4 illustrates another attenuator wheel that can be used instead of the wheel 22 illustrated in FIG. 2. FIG. 4 illustrates a multiple cycle wheel 80. The wheel is comprised of two attenuation cycles having three attenuators each. Attenuators 82 have the least attenuation. Attenuators 84 have a larger degree of attenuation than attenuators 82, and attenuators 86 have the highest degree of attenuation. Non-attenuation portions 88 separate the attenuation cycles on attenuation wheel 80 and do not attenuate the light pulse. The multiple cycles in wheel 80 are used so as not not to unduly restrict the laser firing rate. Wheel 80 permits the laser to fire at least twice for one revolution of wheel 80. It should be understood that any number of multiple attenuating cycles can be used together with any number of attenuators for each cycle. Holes 26 in FIGS. 3 and 4 are used to determine the angular position of the wheels.

While the wheel attenuators in FIG. 3 and 4 have been illustrated with varying degrees of shading this shading is representative of the degree of attenuation of the light pulse at the particular frequency used and need not appear when viewed in the visible spectrum.

Although the preferred embodiment has been illustrated and described together with other embodiments, it will be obvious to those skilled in the art that various modifications may be made without departing from the spirit and scope of this invention.

What is claimed is:

1. An exposure control system comprising:
   a pulsed light source;
   variable attenuation means, placed between said pulsed light source and the system to be exposed, for variably attenuating the light emitted by said pulsed light source;
   exposure dose monitor means, placed between said variable attenuation means and the system to be exposed, for monitoring the exposure dose of the attenuated light pulses; and
   control means, associated with said exposure dose monitor means, said variable attenuation means, and said pulsed light source, for controlling the attenuation of the light emitted by said pulsed light source by said variable attenuation means whereby exposure can be accurately controlled with a minimum of light pulses from said pulsed light source.

2. An exposure control system as in claim 1 wherein: said pulsed light source is an X-ray source.

3. An exposure control system as in claim 1 wherein: said pulsed light source is a plasma blackbody XUV source.

4. An exposure control system as in claim 1 wherein: said pulsed light source is a laser.

5. An exposure control system as in claim 4 wherein: said laser is an excimer laser.

6. An exposure control system as in claim 4 wherein: said laser is a free-electron laser.

7. An exposure control system as in claim 4 wherein: said laser is a frequency multiplied laser.

8. An exposure control system as in claim 1 wherein: said variable attenuation means comprises a movable continuous attenuation gradient ranging from a high attenuation to a low attenuation.

9. An exposure control system as in claim 1 wherein said variable attenuation means comprises:
   a wheel,
   a plurality of discrete attenuations spaced annularly a predetermined distance apart on said wheel,
   means for rotating said wheel; and
   means for detecting the angular position of said wheel.

10. An exposure control system as in claim 9 wherein: each of said plurality of attenuators have a different attenuation.

11. An exposure control system as in claim 10 wherein: each of said plurality of attenuators differ in attenuation by equal logarithmic steps.

12. An exposure control system as in claim 9 wherein: said plurality of attenuators are separated into groups by non-attenuating sections.

13. An exposure control system as in claim 12 wherein: each of said groups are the same.

14. An exposure control system as in claim 1 wherein said exposure dose monitor means comprises:
   a beam splitter; and
   a beam detector.

15. An exposure control system as in claim 1 further comprising:
   a fixed attenuator positioned in the path of light emitted by said pulsed light source.

16. An exposure control system as in claim 1 wherein: said control means further comprises means for determining a cumulative exposure dose delivered by said pulsed light source after being attenuated.

17. An exposure control system as in claim 16 wherein: said control means further comprises means for repeatedly calculating the pulsed light source energy distribution function based on recent performance of said pulsed light source.

18. An exposure contol system as in claim 1 wherein said control means further comprises:
   cumulative dose means, associated with said exposure dose monitor means, for maintaining a cumulative exposure dose of attenuated light pulses emitted by said pulsed light source;
   exposure dose calculation means, associated with said cumulative dose means, for calculating the attenuation needed for a next exposure dose in order to fall within a predetermined exposure tolerance;
   selection means for selecting an attenuation from said variable attenuation means that most closely approaches the degree of attenuation calculated by said exposure dose calculation means;

attenuation movement means, associated with said variable attenuation means and said selection means, for moving the attenuation selected from said variable attenuation means into the path of light emitted by said pulsed light source; and pulse stimulation means for controllably stimulating a pulse of light from said pulsed light source.

19. An exposure control system for use in photolithography comprising:

a pulsed laser light source capable of emitting multiple exposure doses of light which could fluctuate in exposure dose with each pulse;

a wheel having a plurality of openings equally spaced along the circumferential portion, the openings capable of being positioned in the path of light emitted from said pulsed laser light source;

a plurality of attenuators each capable of attenuating differing quantities of the multiple exposure doses, a different one of said plurality of attenuators being placed in each of said plurality of openings;

a motor for rotating said wheel;

sensor means for detecting the angular position of said wheel;

a beam splitter positioned in the path of the multiple exposure doses after being attenuated;

a detector positioned in the path of the portion of the multiple exposure doses diverted by said beam splitter;

cumulative dose means, associated with said detector, for measuring the cumulative exposure dose generated by the attenuated multiple exposure doses;

storage means for storing a pulse energy distribution of a number of prior exposure doses emitted by said pulsed laser light source;

exposure dose calculating means, associated with said cumulative dose means and said storage means, for calculating the attenuation needed for a next exposure dose in order to fall within a predetermined exposure tolerance;

selection means for selecting an attenuator from said plurality of attenuators that most closely approaches the degree of attenuation calculated by said exposure dose calculating means;

motor control means, associated with said selection means and said motor, for positioning the attenuator into the path of light emitted by said pulsed laser light source; and laser shot stimulating means for stimulating a pulse of light from said pulsed laser light source.

* * * * *